United States Patent [19]

Omote et al.

[11] Patent Number: 5,273,855
[45] Date of Patent: Dec. 28, 1993

[54] METHOD OF FORMING MULTI-COLOR IMAGE

[75] Inventors: Hisahiro Omote; Masahiro Yoshikawa; Masahide Takano, all of Higashimatsuyama, Japan

[73] Assignee: Sanyo-Kokusaku Pulp Co., Ltd., Tokyo, Japan

[21] Appl. No.: 795,552

[22] Filed: Nov. 21, 1991

[30] Foreign Application Priority Data

Jun. 18, 1991 [JP] Japan .................. 3-173156

[51] Int. Cl.$^5$ .............................. G03C 1/805
[52] U.S. Cl. .............................. 430/143; 430/257; 430/263; 430/293
[58] Field of Search ............... 430/143, 257, 293, 263

[56] References Cited

U.S. PATENT DOCUMENTS

| | | | |
|---|---|---|---|
| 4,482,625 | 11/1984 | Namiki et al. | 430/143 |
| 4,719,169 | 1/1988 | Platzer et al. | 430/143 |
| 4,762,766 | 8/1988 | Melbye | 430/143 |
| 4,766,053 | 8/1988 | Shinozaki et al. | 430/256 |
| 4,877,712 | 10/1989 | Namiki et al. | 430/256 |
| 5,001,034 | 3/1991 | Omote et al. | 430/257 |
| 5,004,668 | 4/1991 | Namiki et al. | 430/256 |
| 5,057,394 | 10/1991 | Yabe et al. | 430/145 |
| 5,100,757 | 3/1992 | Platzer et al. | 430/143 |

FOREIGN PATENT DOCUMENTS 0403128 12/1990 European Pat. Off. .
3818130 12/1988 Fed. Rep. of Germany .
61-189535 8/1986 Japan .
63-311349 12/1988 Japan .
1-180540 7/1989 Japan .
2-308253 12/1990 Japan .
3-21955 1/1991 Japan .

Primary Examiner—Charles L. Bowers, Jr.
Assistant Examiner—Mark F. Huff
Attorney, Agent, or Firm—Armstrong, Westerman, Hattori, McLeland & Naughton

[57] ABSTRACT

(Objective) In a color-proof material performed by forming multi-color image on an arbitrary material (ultimate image-receiving material) such as paper using a photosensitive transfer sheet and an intermediate image-receiving sheet, the objective is to bring the quality close to the printed quality formed with inks alone.

(Constitution) For the photosensitive sheet, the colored photosensitive layer is formed with a material comprising a synthetic resin emulsion with $Tg = -20°$ to 40° C. such as acrylic ester or ethylene-vinyl acetate copolymer so that the image layer itself has heat-adhesivity. Moreover, the image-receiving layer of the intermediate image-receiving sheet is formed with a material containing a resin cross-linked copolymer of olefin and $\alpha, \beta$-unsaturated carboxylic acid with metallic ions and a resin comprising a copolymer of ethylene and vinyl acetate in a proportion by weight of 100/0 to 10/90.

(Effect) It becomes possible to transfer the image layer alone onto the ultimate image-receiving material, thus a color-proof close to the print formed with inks alone can be produced.

7 Claims, No Drawings

METHOD OF FORMING MULTI-COLOR IMAGE

BACKGROUND OF THE INVENTION

The present invention relates to a method of forming a a multi-color image and materials for forming multi-color image to be used therefor. In more detail, it relates to a method of forming a multi-color image in the color-proof for color-proofing used for the proofing operation during printing and plate-making processes.

In the color printing, a material called color-proof for color-proofing is commonly used in order to check the color after finishing printing, the reproduction of tone, etc, in various operating processes of plate-making.

This color-proof has been made so far mainly by surprint method, overlay method, transfer method, etc. depending on the form thereof.

Recently, among them, the transfer method having relatively good color-reproducibility and operativity is often used as a general-purpose method.

In most of this transfer system, however, because the surface of the ultimate image-receiving material (hereinafter, referred to as ultimate material) forming the image is covered with a layer comprising organic high-molecular substance in all cases as described in Japanese Unexamined Patent Publication No. Sho 47-41830, No. Sho 61-286857, No. Sho 61-286858, etc., the gloss of the surface of the image obtained is too high leading to a problem that it affords a different impression from the image quality on actual printing.

Also, for the purpose of adjusting the gloss on the surface of the image, a method is used of changing the surface gloss of the image, wherein a matted sheet, the surface thereof being coarsened, and the surface of the image formed on the ultimate material are superposed and then treatments such as pressurizing and heating are performed. But, it has a problem in operativity in such ways that the operation of this method itself is troublesome, many kinds of matted sheets are required for obtaining the aimed gloss, and others.

Next, in a method, wherein a transferable colored image is transferred onto an intermediate image-receiving sheet (hereinafter, referred to as an intermediate sheet) and then it is transferred onto a permanent supporter, as described in Japanese Unexamined Patent Publication No. Sho 61-189535, when transferring onto the permanent supporter such as paper under heat and pressure after the colored image transferable onto the intermediate sheet material comprising a first layer and a second layer has been transferred onto the intermediate sheet, there are advantages that said layers are embedded corresponding to irregularities of paper to facilitate the close contact with paper and a matting process is not required on releasing. However, because the non-image area is covered with a layer comprising organic high-molecular substance, the finish becomes different from the actual printed matter after all.

Moreover, in Japanese Unexamined Patent Publication No. Hei 3-21955 a method is disclosed, wherein an ionomer resin is contained in the image-receiving layer of the intermediate sheet, and the image alone is temporarily transferred thereonto under pressure and heat. Then as a next process, an ultimate material such as paper is superposed on the surface of the image formed on the intermediate sheet, and finally the image area alone is transferred onto the ultimate material under pressure and heat to make a proof. This method surely allows the image area alone to be transferred onto the ultimate material, thus the finish is close to the printed matter. The image layer used therefor however comprises a colored photosensitive resin layer and a heat-adhesive release layer in order to increase the adhesive force between image layers when the image layers are superposed one on another upon transferring. Due to the interposition of release layers between colored photosensitive resin layers of respective colors, optical dot gains are caused in the final image layer on the ultimate material resulting in a different tone from the actual printed matter.

In view of the problems as described above, the invention aims at that, by finally transferring the real image of the image layer alone on the supporter onto the ultimate material and by forming the image layer with a colored photosensitive layer alone without providing the heat-adhesive layer in that image layer, the surface of the non-image area on the ultimate material is exposed, thus achieving the image quality quite close to that of a print formed with inks alone in the reproducibility of the image area.

SUMMARY OF THE INVENTION

The objective as above can be attained as follows:

On a photosensitive transfer sheet coated with a release layer and a colored photosensitive layer in sequence on a supporter, a colored image is formed through the exposure to light for imaging and the development treatment, and the colored image layer alone is transferred onto an intermediate sheet having an image-receiving layer. Next, the colored image layer formed on the image-receiving layer is transferred onto an ultimate material. In this method, by using a material having the heat adhesive function by itself after development for the colored photosensitive layer of a photosensitive transfer sheet, the heat adhesive layer required hitherto is not needed, and yet, by solely using a resin crosslinked copolymer of olefin and $\alpha$, $\beta$-unsaturated carboxylic acid with metallic ions or by mixingly using it with a resin comprising copolymer of ethylene and vinyl acetate for the image-receiving layer of an intermediate sheet, none is transferred from the image-receiving layer of the intermediate sheet when forming a multi-color image on the ultimate material. Thus, it becomes possible to form a multi-color image with image layers alone on the ultimate material.

DETAILED DESCRIPTION OF THE INVENTION

In the following, the invention will be illustrated in more detail.

For the photosensitive transfer sheet and the intermediate sheet to be used in the invention, transparent supporters are used. As the transparent supporters, traditionally known plastic films are applied. For example, transparent plastic films such as poly(ethylene terephthalate), polypropylene, polyethylene, poly(vinyl chloride), polystyrene, polycarbonate and triacetate can be mentioned. In particular, biaxially stretched poly(ethylene terephthalate) film is preferable because of its excellent strength, heat resistance, dimensional stability, transparency, economics, etc. The thickness of the transparent supporter is not particularly restricted, but it is preferable to be 50 to 150 $\mu$m from the points of operativity etc.

The photosensitive transfer sheet used in the invention comprises a transparent supporter, a release layer and a colored photosensitive layer.

For the substances for forming the release layer of the invention, styrene-maleic anhydride resin, polyester resin, acrylic resin, melamine resin and vinylidene chloride resin are suitable. They are used solely or mixingly.

The thickness of the release layer is preferable to be 0.1 to 10 μm, in particular, 1.0 to 3.0 μm.

Moreover, the surface of the release layer may be matted (coarsened), if need be. The method therefor is to add a matting agent to the release layer. The matting agents used for such purpose include fine particles of inorganic particles such as silicon dioxide, calcium carbonate and alumina, plastic powders such as polyethylene, polypropylene, poly(ethylene terephthalate), polystyrene, polycarbonate, acrylic ester resin, methacrylic ester resin, polyacrylonitrile and copolymer of acrylonitrile, and the like. The particle size of a matting agent is suitable to be 0.01 to 10 μm and the type, particle size and addition level of the matting agent can be controlled depending on the degree of matting.

The colored photosensitive layer used in the invention utilizes a positive type photosensitive composition developable with water or warm water alone without using chemicals such as organic solvents and alkalies at all. It utilizes a phenomenon for obtaining the positive type photosensitive composition using a traditionally negative type photosensitive composition.

The positive type photosensitive compositions used in the invention are same as those described in Japanese Unexamined Patent Publication No. Sho 63-311349 and No. Hei 1-180540.

The mechanism of image formation is such that the area of the photosensitive layer exposed to light through the positive manuscript is insolubilized and swollen by water, thus permitting easy removal, and, in the non-exposed area of the photosensitive layer, the water-soluble photosensitive component dissolves out by water, but the synthetic resin emulsion and coloring agent are left behind as they are, thus permitting image formation.

This image formation in the photosensitive layer will be described in more detail. However, in order to clarify the characteristics of this photosensitive layer, we define the photosensitive layer as a layer coated with a composition comprising a water-soluble photosensitive component, synthetic resin emulsion and a coloring agent onto a supporter and drying the coating layer by heating to make a film.

Exposed Area

The water-soluble photosensitive component in the photosensitive layer exposed to active rays is insolubilized into water. And, when dipping into water, this crosslinked component swells easily to soften this area of the photosensitive layer. Also, the adhesion to the supporter is decreased. Hence, by rubbing with sponge etc., this area is easily removed from the supporter.

Non-Exposed Area

When dipping into water, most of the water-soluble photosensitive component in the photosensitive layer dissolves out, but the photosensitive layer shows no changes of swelling, softening, etc. and the adhesion to the supporter also does not change. Thus, it is not removed from supporter even by rubbing with a sponge. Moreover, most of the colored component of water-soluble photosensitive component in the photosensitive layer dissolves out. This photosensitive layer becomes therefore a layer formed with synthetic resin emulsion alone containing coloring agent by making a film. That is to say, since this non-exposed area of photosensitive layer corresponds to the image area, the image layer becomes a layer formed with synthetic resin emulsion alone containing coloring agent by making a film.

The synthetic resin emulsion to be mixed into said colored photosensitive liquor for the photosensitive transfer sheet used in the invention has a glass transition temperature of −20° to 40° C. and is selected from any of poly(acrylic ester), copolymer of acrylic ester, copolymer of ethylene and vinyl acetate and copolymer containing ethylene and vinyl acetate or any of mixtures of these. This image layer formed through the exposure to light and the development treatment is therefore to have the heat-adhesivity by itself.

By using this colored photosensitive layer and by forming the image layer along having the heat-adhesivity, it has become possible to adhere each image area when superposing one image area on an other image area, which has been a problem hitherto on transferring image layers alone, without providing the release layer having heat-adhesivity under the image layer.

Next, explanation will be made about the water-soluble photo-crosslinking agent and water-soluble resin used for this photosensitive layer.

For the water-soluble photo-crosslinking agents, water-soluble azido compounds, diazonium salts, tetrazonium salts and other known organic photosensitive substances can be used. Here, some of them are exemplified.

Water-Soluble Azido Compounds:
Sodium 4,4'-diazidostilbene-2,2'-disulfonate
Sodium 4'-azido-4-azidobenzalacetophenone-2-sulfonate
Sodium 4,4'-diazidostilbene-α-carboxylate
Sodium di-(4-azido-2'-hydroxybenzal)acetone-2-sulfonate
Sodium 4-azidobenzalacetophenone-2-sulfonate Diazo Resins:
Condensate of p-diazodiphenylamine with formaldehyde Tetrazonium Salts
Double salt of diphenyl-4,4'-bisdiazonium chloride and zinc chloride
Double salt of 3,3'-dimethyldiphenyl-4,4'-bisdiazonium chloride and zinc chloride
Double salt of 3,3'-dimethoxydimethyl-4,4'-bisdiazonium chloride and zinc chloride
Double salt of diphenylamine-4,4'-bisdiazonium chloride and zinc chloride
Double salt of diphenylmethane-4,4'-bisdiazonium chloride and zinc chloride As the water-soluble resins, many substances such as polyacrylamide, poly(vinyl pyrrolidone), graft-polymerization products of vinyl monomers onto poly(vinyl alcohol), water-soluble poly(vinyl butyral), glue, casein, gelatin, arabic gum egg albumin, gums, alginic acids, poly(ethylene oxide), poly(acrylic acid) and its salts, poly(methacrylic acid) and its salts, mixtures of these and further mixtures of these with poly(vinyl alcohol) and cellulose derivatives such as carboxymethylcellulose and hydroxymethylcellulose can be mentioned.

Next, explanation will be made about the synthetic resin emulsion used.

As the synthetic resin emulsions, many substances with a glass transition temperature of −20° to 40° C. such as poly(acrylic ester), copolymer of ethylene and vinyl acetate, poly(vinylidene chloride), poly(vinyl acetate), polyurethane, poly(vinyl chloride), and copolymers or mixtures of these can be mentioned.

Further, traditionally known water-dispersible colored pigments, water-soluble dyes, leveling agents, stabilizers, matting agents, etc. can be added to these, if need be.

Moreover, the formulation ratio in terms of solids of water-soluble resin previously mentioned to said synthetic resin emulsion is 1/99 to 80/20 and more preferably is 5/95 to 40/60. If water-soluble resin is too much, the water resistance of the image will decrease and the image will drop out on development. If synthetic resin emulsion is too much, the developability will decrease. When remarkably out of said range, the image cannot be obtained. Moreover, the formulation ratio in terms of solids of the sum of water-soluble resin and synthetic resin emulsion to water-soluble photo-crosslinking agent is 98/2 to 70/30 and more preferably is 96/4 to 80/20. If water-soluble photo-crosslinking agent is less than this, the sensitivity and the image quality will be remarkably lowered. Inversely, also, if too much, the lowering of image quality will occur. When remarkably out of said range, the image cannot be obtained. Further, with respect to the coloring agents, it is preferable to add the colored pigment in amounts of not more than 20% and the water-soluble dye in amounts of not more than 10%, respectively, to the sum of solids of water-soluble photo-crosslinking agent, water-soluble resin and synthetic resin emulsion. These said components constituting the photosensitive composition are dissolved or dispersed into water, water/alcohol mixed liquor or the like for preparation.

In the following, explanation will be made about the intermediate sheet used in the invention.

It is also possible to form the image-receiving layer of the intermediate sheet used in the invention on the supporter as it is, but it is preferable to form it on a supporter provided with a primer treatment.

As the resins for forming the primer layer, application of polyester, polyurethane, ethylene-vinyl acetate copolymer, acrylic ester-styrene copolymer, etc. is possible, but the application of polyurethane obtainable by crosslinking isocyanate and acrylic polyol is most preferable.

When coating the primer layer, the coating process is not particularly restricted and may be any of traditionally known methods. Moreover, the thickness of the layer is preferable to be 0.3 to 3.0 μm or so.

The image-receiving layer of the intermediate sheet of the invention comprises a sole resin intermolecularly crosslinked copolymer of olefin and α, β-unsaturated carboxylic acid with metallic ions or a mixture thereof with a resin comprising copolymer of ethylene and vinyl acetate.

The methods of forming a sole layer of this resin intermolecularly crosslinked copolymer of olefin and α, β-unsaturated carboxylic acid with metallic ions or a mixed layer thereof with resin comprising copolymer of ethylene and vinyl acetate include a method wherein these resins are molten by heating and then mixed resins are extruded to coat onto the supporter and a method wherein individual resin is converted to an aqueous dispersion, they are mixed and then the mixture is coated onto the supporter and dried to obtain a layer. In the invention, the method of forming this image-receiving layer is not restricted.

Next, as the olefins for forming the image-receiving layer of the invention, ethylene, propylene, 1-butene, 1-pentene, 1-hexene, 4-methyl-1-pentene, 1-octene, isobutylene, etc. can be utilized.

The α, β-unsaturated carboxylic acid being a polymerizable monomer for forming the image-receiving layer of the invention usually has carbon atoms of 2 to 8 or so and, for example, acrylic acid, methacrylic acid, α-ethyleneacrylic acid, maleic acid, monomethyl maleate, itaconic acid, etc. can be mentioned. Moreover, in place of these α, β-unsaturated carboxylic acids, methyl acrylate, ethyl acrylate, methyl methacrylate n-butyl methacrylate, dimethyl fumarate, diethyl itaconate, dimethyl maleate etc. being esters thereof can be used.

One kind or combiningly two or more kinds of said olefins and α, β-unsaturated carboxylic acids or esters being polymerizable monomers may be used, respectively.

As the metallic ions for intermolecularly crosslinking copolymer of olefin and α, β-unsaturated carboxylic acid, which forms the image-receiving layer of the invention, ions of zinc, magnesium, etc. can be utilized besides those of alkali metals such as lithium, sodium and potassium.

The proportion of copolymerization of olefin to α, β-unsaturated carboxylic acid in the resin intermolecularly crosslinked copolymer of olefin and α, β-unsaturated carboxylic acid with metallic ions of the invention is preferable to be not less than 50%. This is because of that, if the addition level is under 50%, such excellent features as heat-adhesivity to image, improved releasability from transferred image, improved releasability after heat-adhesion to paper etc. and non-transfer onto heated and pressurized roll utilizing on transfer, which can be obtained by adding the resin intermolecularly crosslinked copolymer of olefin and α, β-unsaturated carboxylic acid with metallic ions to the resin comprising copolymer of ethylene and vinyl acetate, will become not to be seen.

The degree of crosslinking with metallic ions in the resin intermolecularly crosslinked copolymer of olefin and α, β-unsaturated carboxylic acid with metallic ions of the invention is preferable to be 20 to 65%. If the degree of crosslinking is under 20%, excellent features of heat-adhesivity to image, improved releasability from transferred image, improved releasability after heat-adhesion to paper etc. and non-transfer onto heated and pressurized roll utilizing on transfer will become not to be seen as the case of said proportion by weight of copolymerization of α, β-unsaturated carboxylic acid in the resin intermolecularly crosslinked copolymer of olefin and α, β-unsaturated carboxylic acid with metallic ions. Also, if the degree of crosslinking is markedly high, the moisture in the environment will tend to affect. In particular, if the coated film remarkably absorbs the moisture, the heat-adhesivity to image and the releasability from transferred image will decrease.

The production method itself of this resin intermolecularly crosslinked copolymer of olefin and α, β-unsaturated carboxylic acid with metallic ions is well known and, for example, methods described in Japanese Patent Publication No. Sho 39-6810, Japanese Unexamined Patent Publication No. Sho 49-121891, etc. are adoptable. Moreover, as the water-dispersing methods of this resin, methods described in Japanese Unexamined Patent Publication No. Sho 51-62890, No. Sho 55-98242, etc. are utilizable.

The ratio by weight of ethylene to vinyl acetate in the resin comprising copolymer of ethylene and vinyl acetate used for the image-receiving layer of the invention is preferable to be 95/5 to 65/35. If the ratio by weight of vinyl acetate is under this range, sufficient heat-adhesivity cannot be obtained. Also, if over this range, the stickiness will generate to make the positioning operation etc. on image transfer difficult.

The melt index (according to the method of ASTM D-1238) of the resin comprising copolymer of ethylene and vinyl acetate used for the image-receiving layer of the invention is preferable to be within a range of 5 to 350 g/min. If the melt index is under this range, the heat-adhesivity to image will decrease and, if over the range, problems of decreased releasability from transferred image, inability of re-release when directly adhered to paper etc. and the like will be caused.

The constitution of the sole resin intermolecularly crosslinked copolymer of olefin and α,β-unsaturated carboxylic acid with metallic ions or the mixture thereof with the resin comprising copolymer of ethylene and vinyl acetate for forming the image-receiving layer is principally determined from the balance between the adhesive force between image layer formed on the photosensitive transfer sheet and image-receiving layer and the releasing force between image layer and image-receiving layer after being transferred onto the ultimate material. Namely, it is preferable from the operativity that, after the image layer formed on the photosensitive transfer is transferred sheet onto the image-receiving sheet through simultaneous manipulation of heating and pressurizing, the transparent supporter of photosensitive transfer sheet can be released by a releasing force (according to ASTM D-903-49: releasing speed=300 mm/min) of 2.0 to 4.5 g/25 mm. Hence, the image layer is required to adhere to the image-receiving layer on the intermediate sheet more strongly than this, but, if this adhesive force is too strong, such a phenomenon is caused that, when releasing the intermediate sheet together with the image-receiving layer after the image layer is transferred onto the ultimate material, the image layer cannot be released from the image-receiving layer and it cannot be transferred onto the ultimate material. Also, if the adhesive force is too weak, such a phenomenon that, when releasing the transparent supporter of photosensitive transfer sheet, the image layer is not transferred onto the image-receiving layer and it ends up to be left behind on the side of photosensitive transfer sheet can be caused. Hence, the adhesive force between the image layer and the image-receiving layer is desirable to be within a range releasable by a releasing force of 4.5 to 30 g/25 mm. For such reasons, the constitution of the image-receiving layer is determined from the balance between the adhesive force and the releasing force and the constitution of the mixture of resin intermolecularly crosslinked copolymer of olefin and α, β-unsaturated carboxylic acid with metallic ions with resin comprising copolymer of ethylene and vinyl acetate is selected from ratios by weight of 100/0 to 10/90.

Moreover, the thickness of the image-receiving layer of the intermediate sheet is required to be higher than the sum of the of a thickness of all image layers transferred and the depth of surface irregularities of ultimate body. Too high thickness results in a drawback of poor registering precision on superposing the images with respective colors. Usually, when selecting the printing paper for ultimate material, the thickness of the image-receiving layer is preferable to be selected within a range of 15 to 150 μm.

Using the materials as described above, the preparation procedure of a color proof by the multi-color image forming method will be explained below.

1. A positive type manuscript is superposed on the photosensitive transfer sheet and exposed to active rays (usually ultraviolet rays) and the latter is dipped into warm water (for 30 to 60 seconds in water of 40° to 50° C.) and developed by rubbing to form the image. By this method, four separate-color images of yellow, magenta, cyan and black are formed.

2. A separate-color image is superposed on the image-receiving layer of the intermediate sheet and passed through a pair of rolls heated and pressurized, thereby the image layer of separate-color image is laminated with the image-receiving layer. After cooling, the transparent supporter of a photosensitive transfer sheet is released to remove. Further, remaining separate-color images are similarly transferred in sequence onto the separate-color image transferred.

It is preferable to set the heating temperature of roll at 80° to 130° C. and to apply a pressure of 1.0 to 6.0 Kgf/cm² from both ends of the roll.

3. All separate-color image layers transferred onto the intermediate sheet, all separate-color images having been transferred, are laminated with the ultimate material and, after cooling, the intermediate sheet is released to form the multicolor image on the ultimate material.

EXAMPLE

The examples of the invention will be shown below, but the invention is not confined to these. Besides, parts mean parts by weight and % means % by weight.

| 1. (Liquor for forming release layer of photosensitive transfer sheet) | |
|---|---|
| Release layer-forming liquor A | |
| Saturated polyester (30% liquor) (Thermolac F-1: made by Soken Kagaku Co.) | 49 parts |
| Acrylic ester-melamine copolymer (40% liquor) (Tespeel XA 51-824A: made by Hitachi Kasei Polymer Co.) | 0.75 parts |
| p-Toluenesulfonic Acid (10% liquor) | 0.25 parts |
| Toluene | 20 parts |
| Methyl ethyl ketone | 20 parts |
| Cyclohexanone | 10 parts |
| Release layer-forming liquor B | |
| Styrene-maleic anhydride resin (100%) (Styrite HS-1: made by Daido Kogyo Co.) | 10 parts |
| Saturated polyester (30% liquor) (Thermolac F-1: made by Soken Kagaku Co.) | 30 parts |
| Methanol | 40 parts |
| Toluene | 20 parts |
| Release layer-forming liquor C | |
| Vinylidene chloride (40% liquor) (Kurehalon SOA: made by Kureha Chemical Co.) | 7.5 parts |
| Acrylic ester-melamine copolymer (40% liquor) (Tespeel TA 51-824A: made by Hitachi Kasei Polymer Co.) | 20 parts |
| p-Toluenesulfonic Acid (50% liquor) | 1.5 parts |
| Toluene | 30 parts |
| Methyl ethyl ketone | 30 parts |
| Cyclohexanone | 11 parts |
| 2. (Liquor for forming colored photosensitive layer of photosensitive transfer sheet) | |
| Colored photosensitive layer-forming liquor A | |
| Sodium 4,4'-diazidostilbene-2,2'-disulfonate | 2.1 parts |
| Poly(vinyl pyrrolidone) (45% liquor) (PVP K-60: made by General Anilin & Film Co.) | 4 parts |
| Poly(acrylic ester) emulsion (46% liquor) | 15.6 parts |

-continued

| | |
|---|---|
| (Primal B-15 (Tg = −9° C.): made by Nihon Acryl Kagaku Co.) | |
| Colored pigment dispersion | 5 parts |
| Methanol | 20 parts |
| Water | 53.3 parts |
| Colored photosensitive layer-forming liquor B | |
| Condensate of p-diazodiphenylamine with formaldehyde | 2 parts |
| Polyacrylamide (10% liquor) (Degree of polymerization 10000: made by Nakarai Kagaku) | 22.5 parts |
| Ethylene-vinylacetate copolymer (50% liquor) (Sumikaflex-751 (Tg = −15° C.): made by Sumitomo Chemical Co.) | 13.5 parts |
| Colored pigment dispersion | 5 parts |
| Methanol | 20 parts |
| Water | 37 parts |
| Colored photosensitive layer-forming liquor C | |
| Sodium 4,4′-diazidostilbene-2,2′-disulfonate | 1.2 parts |
| Poly(vinyl pyrrolidone) (45% liquor) (PVP K-60: made by General Anilin & Film Co.) | 3 parts |
| Ethylene-vinylacetate copolymer (50% liquor) (Sumikaflex-702 (Tg = 0° C.): made by Sumitomo Chemical Co.) | 15.3 parts |
| Colored pigment dispersion | 5 parts |
| Methanol | 20 parts |
| Water | 55.5 parts |

Besides, said colored pigment dispersion used for colored photosensitive layer-forming liquor can be obtained by dispersing on ink-mixing mill using following formulation.

| | |
|---|---|
| Pigment | 60 parts |
| Hydroxypropylmethylcellulose (Metrose 60SH4000: made by Shinetsu Chemical Co.) | 10 parts |
| Nonionic surfactant (Polyethyleneglycol alkylphenyl ether) | 1 part |
| Water | 229 parts |

*As the pigments, black: carbon black, yellow: Permanent Yellow HR, magenta: Permanent Carmine FB and cyan: phthalocyanine Blue were used.

3. (Liquor for forming primer treatment layer of intermediate image-receiving sheet)

| | |
|---|---|
| Acrylicpolyol (50% liquor) (Thermolac U-245B: made by Soken Kagaku Co.) | 45 parts |
| Isocyanate (75% liquor) (Takenate D-110N: made by Takeda Chemical Industries Ltd.) | 20 parts |
| Silica (Mizukasil SK-7: Mizusawa Kagaku Co.) | 5 parts |
| Toluene | 100 parts |
| Ethyl acetate | 100 parts |
| Ethyl cellosolve | 50 parts |

Liquor for Forming Image-Receiving Layer of Intermediate Image-Receiving Sheet

Image-Receiving Layer-Forming Liquor A

Aqueous Dispersion of Resin Crosslinked the Molecules of Copolymer of Olefin with α, β-Unsaturated Carboxylic Acid with Metal Ions 25% Aqueous dispersion comprising:
Olefin: ethylene
α, β-Unsaturated carboxylic acid: methacrylic acid
Metal ion: sodium
Copolymerization ration of olefin to β, β-unsaturated carboxylic acid: 85/15
Crosslinking degree: 35%

Aqueous Dispersion of Resin Comprising Copolymer of Ethylene with Vinyl Acetate

35% Aqueous dispersion comprising:
Copolymerization ratio of ethylene to vinyl acetate: 85/15
Melt index: 150
Mixing ration in solids of (aqueous dispersion of resin crosslinked with the molecules of copolymer of olefin with α, β-unsaturated carboxylic acid with metal ions) to (aqueous solution of resin comprising copolymer of ethylene with vinyl acetate): 20/80

Image-Receiving Layer-Forming Liquor B

Aqueous Dispersion of Resin Crosslinked with the Molecules of Copolymer of Olefin with α, β-Unsaturated Carboxylic Acid with Metal Ions 25% Aqueous dispersion comprising:
Olefin: ethylene
α, β-Unsaturated carboxylic acid: methacrylic acid
Metal ion: sodium
Copolymerization ratio of olefin to α, β-unsaturated carboxylic acid: 85/15
Crosslinking degree: 35%

Aqueous Dispersion of Resin Comprising Copolymer of Ethylene with Vinyl Acetate

35% Aqueous dispersion comprising:
Copolymerization ratio of ethylene to vinyl acetate: 85/15
Melt index: 150
Mixing ratio in solids of (aqueous dispersion of resin crosslinked with the molecules of copolymer of olefin with α, β-unsaturated carboxylic acid with metal ions) to (aqueous solution of resin comprising copolymer of ethylene with vinyl acetate): 50/50

Image-Receiving Layer-Forming Liquor C

Aqueous Dispersion of Resin Crosslinked with the Molecules of Copolymer of Olefin with α, β-Unsaturated Carboxylic Acid with Metal Ions 25% Aqueous dispersion comprising:
Olefin: ethylene
α, β-Unsaturated carboxylic acid: methacrylic acid
Metal ion: sodium
Copolymerization ratio of olefin to α, β-unsaturated carboxylic acid: 85/15
Crosslinking degree: 55%

Aqueous Dispersion of Resin Comprising Copolymer of Ethylene with Vinyl Acetate

35% Aqueous dispersion comprising:
Copolymerization ratio of ethylene to vinyl acetate: 85/15
Melt index: 150
Mixing ratio in solids of (aqueous dispersion of resin cross-linked with the molecules of copolymer of olefin with α, β-saturated carboxylic acid with metal ions) to (aqueous solution of resin comprising copolymer of ethylene with vinyl acetate): 100/0

EXAMPLE 1

Preparation Method of Photosensitive Transfer Sheet

Using the release layer-forming liquor A, a release layer with a dried film thickness of 2 μm was coated onto a 100 μm thick biaxially stretched poly(ethylene terephthalate) film. Further, using the colored photosensitive layer-forming liquor A (dispersion pigment is black), a colored photosensitive layer with a dried film thickness of 2 μm was coated onto the release layer, thereby a photosensitive transfer sheet for black was prepared.

Similarly, using the colored photosensitive layer-forming liquors A, in which dispersion pigments were varied, photosensitive transfer sheets for yellow, magenta and cyan were prepared.

These four photosensitive transfer sheets were superposed respectively with color-decomposed positive films corresponding to respective colors and appropriate exposure (two-column continuous tone keil using Ugra offset inspection keil) was given in each case with ultrahigh-pressure mercury lamp. Then, after being dipped into warm water of 40° C. for 30 seconds, each of them was rubbed with a sponge to obtain four transfer sheets of black, yellow, magenta and cyan.

Preparation Method of Intermediate Image-Receiving Sheet

Using the primer treatment layer-forming liquor of intermediate image-receiving sheet, a primer layer with a dried film thickness of 2 μm was formed on one side of 125 μm thick biaxially stretched poly(ethylene terephthalate) film, which had been submitted to corona discharge treatment beforehand.

Using the image-receiving layer-forming liquor A, an image-receiving layer with a dried film thickness of 80 μm was formed on the primer layer to obtain an intermediate image-receiving sheet.

Following this, the black image surface of photosensitive transfer sheet having already formed the image was superposed with the image-receiving layer of this intermediate image-receiving sheet and these were passed through a nip of two heated and pressurized rolls (120° C., 4.0 kgf/cm$^2$), thereby the black image layer was laminated with the image-receiving layer. After cooling, the transparent supporter of photosensitive transfer sheet was peeled off together with the release layer.

By this procedure, only a black image layer is transferred onto the image-receiving layer. Further, remaining color-separated images were transferred in sequence by the same procedure onto the image-receiving layer having transferred black image layer in order of yellow, magenta and cyan.

Finally, the surface of four-color image layers transferred onto the image-receiving layer of this intermediate image-receiving sheet was superposed with a coated paper (SK Coat, 105 g/m$^2$: made by Sanyo-Kokusaku Pulp Co., Ltd.) as an ultimate image-receiving material and these were passed through a nip of two heated and pressurized rolls (120° C., 4.0 kgf/cm$^2$), thereby all image layers having been transferred onto the image-receiving layer were laminated with coated paper. After cooling, only four-color image layers were transferred onto the coated paper by peeling off the intermediate image-receiving sheet together with the image-receiving layer, thus forming a multicolor image.

EXAMPLE 2

Preparation Method of Photosensitive Transfer Sheet

Using a similar supporter to Example 1, release layer-forming liquor B and colored photosensitive layer-forming liquor B, photosensitive transfer sheets for black, yellow, magenta and cyan were obtained. Successively, similar exposure to light and development to Example 1 were performed to obtain four transfer sheets.

Preparation Method of Intermediate Image-Receiving Sheet

Using a similar supporter to Example 1, primer treatment layer-forming liquor and image-receiving layer-forming liquor B, an intermediate an image-receiving sheet having image-receiving layer with a film thickness of 100 μm was obtained.

Using the above meterials, a multicolor image was formed on a coated paper by the similar method to Example 1.

EXAMPLE 3

Preparation Method of Photosensitive Transfer Sheet

Using a similar supporter to Example 1, release layer-forming liquor C and colored photosensitive layer-forming liquor C, photosensitive transfer sheets for black, yellow, magenta and cyan were obtained. Successively, similar exposure to light and development to Example 1 were performed to obtain four transfer sheets.

Preparation Method of Intermediate Image-Receiving Sheet

Using similar supporter to Example 1, primer treatment layer-forming liquor and image-receiving layer-forming liquor C, an intermediate an image-receiving sheet having image-receiving layer with a film thickness of 100 μm was obtained.

Using the above materials, a multicolor image was formed on a coated paper by the similar method to Example 1.

EXAMPLE 4

Preparation Method of Photosensitive Transfer Sheet

Using a similar supporter to Example 1, release layer-forming liquor A and colored photosensitive layer-forming liquor B, photosensitive transfer sheets for black, yellow, magenta and cyan were obtained. Successively, similar exposure to light and development to Example 1 were performed to obtain four transfer sheets.

Preparation Method of Intermediate Image-Receiving Sheet

Using a similar supporter to Example 1, primer treatment layer-forming liquor and image-receiving layer-forming liquor C, an intermediate an image-receiving sheet having image-receiving layer with a film thickness of 120 μm was obtained.

Using the above materials, a multicolor image was formed on a coated paper by the similar method of Example 1.

EXAMPLE 5

Preparation Method of Photosensitive Transfer Sheet

Using a similar supporter to Example 1, release layer-forming liquor C and colored photosensitive layer-forming liquor A, photosensitive transfer sheets for black, yellow, magenta and cyan were obtained. Successively, similar exposure to light and development to Example 1 were performed to obtain four transfer sheets.

Preparation Method of Intermediate Image-Receiving Sheet

Using a similar supporter to Example 1, primer treatment layer-forming liquor and image-receiving layer-forming liquor C, an intermediate an image-receiving sheet having image-receiving layer with a film thickness of 100 μm was obtained.

Using the above materials, a multicolor image was formed on a coated paper by the similar method to Example 1.

COMPARATIVE EXAMPLE 1

Preparation Method of Photosensitive Transfer Sheet

Using the following release layer-forming liquor D and thermosensitive adhesive layer-forming liquor, a release layer with a film thickness of 2 μm and, thereon, a thermosensitive adhesive layer with a film thickness of 1.5 μm were formed in sequence on a 100 μm thick biaxially stretched poly(ethylene terephthalate) film.

| Release layer-forming liquor D | |
|---|---|
| Acrylic ester · melamine copolymer (40% liquor) (Tespeel TA51-824A: made by Hitachi Kasei Polymer Co.) | 2 parts |
| Vinyl chloride · vinyl propionate copolymer (40% liquor) (Reulon Qu-628; made by Tosoh Corp.) | 35 parts |
| p-Toluenesulfonic acid | 1.5 parts |
| Silica (Mizukasil SK-7: made by Mizusawa Kagaku Co.) | 2 parts |
| Toluene | 25 parts |
| Methyl ethyl ketone | 25 parts |
| Cyclohexanone | 10 parts |
| Thermosensitive adhesive layer | |
| Polyester (30% liquor) (Bironal MA-14: made by Toyobo Co.) | 20 parts |
| Isopropyl alcohol | 40 parts |
| Water | 40 parts |

Next, on this thermosensitive adhesive layer, a colored photosensitive layer was formed using previously mentioned colored photosensitive layer-forming liquor C. By this method, four photosensitive transfer sheets for black, yellow, magenta and cyan were obtained.

Preparation Method of Intermediate Image-Receiving Sheet

Using the above release layer-forming liquor D and thermosensitive adhesive layer-forming liquor, a release layer with a film thickness of 2 μm and, thereon, a thermosensitive adhesive layer with a film thickness of 8 μm were formed in sequence on a 125 μm thick biaxially stretched poly(ethylene terephthalate) film to prepare an intermediate image-receiving sheet in which this thermosensitive adhesive layer became an image-receiving layer.

Next, the black image surface of the photosensitive transfer sheet having already formed the image was superposed with the image-receiving layer(thermosensitive adhesive layer) of this intermediate image-receiving sheet and these were passed through a nip of two heated and pressurized rolls (120° C., 4.0 kgf/cm$^2$), thereby the black image layer was laminated with the image-receiving layer (thermosensitive adhesive layer). After cooling, the transparent supporter of photosensitive transfer sheet was peeled off together with the release layer. In this case, onto the intermediate image-receiving sheet, both the image layer of photosensitive transfer sheet and the thermosensitive adhesive layer are transferred together. Further, remaining color-separated images were transferred in sequence by the same procedure onto the black image layer and its thermosensitive adhesive layer having already been transferred in order of yellow, magenta and cyan. In these cases, too, for yellow, yellow image layer and its thermosensitive adhesive layer is to be transferred together and, for magenta, magenta image layer and its thermosensitive adhesive layer.

Finally, the four-color image layers and the surface of thermosensitive adhesive layer transferred accompanying therewith, which had been transferred onto the image-receiving layer (thermosensitive adhesive layer) of this intermediate image-receiving sheet, were superposed with a coated paper (SK coat, 105 g/m$^2$: made by Sanyo-Kokusaku Pulp Co., Ltd.) as an ultimate image-receiving material and these were passed through a nip of two heated and pressurized rolls (120° C., 4.0 kgf/cm$^2$), thereby all image layers and all thermosensitive adhesive layers transferred accompanying therewith, which had been transferred onto the image-receiving layer (thermosensitive adhesive layer) of the intermediate image-receiving sheet, were laminated with coated paper. After cooling, four-color image layers, thermosensitive adhesive layers and image-receiving layer (thermosensitive adhesive layer) of intermediate image-receiving sheet are transferred onto the coated paper by peeling off the transparent supporter of intermediate image-receiving sheet together with its release layer. By this method, a multicolor image was formed on the coated paper.

COMPARATIVE EXAMPLE 2

Preparation Method of Photosensitive Transfer Sheet

Transfer sheets for black, yellow, magenta and cyan having similar constitution were obtained using same materials and same method as Comparative example 1.

Preparation Method of Intermediate Image-Receiving Sheet

An intermediate image-receiving sheet having similar constitution was obtained using same materials and same method as Example 1.

Next, the black image surface of photosensitive transfer sheet having already formed the image was superposed with the image-receiving layer of this intermediate image-receiving sheet and these were passed through a nip of two heated and pressurized rolls (120° C., 4.0 kgf/cm$^2$), thereby the black image layer was laminated with the image-receiving layer. After cooling, the transparent supporter of photosensitive transfer sheet was peeled off together with the release layer. In this case, both the image layer of transfer sheet and the thermosensitive adhesive layer are transferred together. Further, remaining color-separated images were transferred in sequence by the same procedure onto the black image layer and its thermosensitive adhesive layer having already been transferred in order of yellow, magenta and cyan. In these cases, too, for yellow, yellow image layer and its thermosensitive adhesive layer is transferred together and, for magenta, magenta image layer and its thermosensitive adhesive layer.

Finally, the four-color image layers and the surface of thermosensitive adhesive layer transferred accompanying therewith, which had been transferred onto the image-receiving layer of this intermediate image-receiving sheet, were superposed with a coated paper (SK Coat, 105 g/m²: made by Sanyo-Kokusaku Pulp Co., Ltd.) as an ultimate image-receiving material and these

TABLE 1

Figures in table indicate dot gain level.

|  |  | Example 1 | Example 2 | Example 3 | Example 4 | Example 5 | Comparative example 1 | Comparative example 2 |
|---|---|---|---|---|---|---|---|---|
| Yellow | 20% | 8% | 9% | 9% | 8% | 9% | 17% | 9% |
| Half-tone dot | 50% | 12% | 11% | 12% | 12% | 13% | 18% | 13% |
| area rate | 80% | 7% | 8% | 8% | 7% | 8% | 10% | 8% |
| Magenta | 20% | 9% | 9% | 10% | 9% | 10% | 19% | 11% |
| Half-tone dot | 50% | 13% | 12% | 13% | 13% | 13% | 21% | 16% |
| area rate | 80% | 8% | 9% | 9% | 9% | 9% | 11% | 10% |
| Cyan | 20% | 10% | 10% | 9% | 10% | 9% | 20% | 11% |
| Half-tone dot | 50% | 13% | 14% | 14% | 13% | 13% | 23% | 15% |
| area rate | 80% | 9% | 10% | 9% | 9% | 9% | 12% | 10% |
| Black | 20% | 9% | 10% | 10% | 9% | 10% | 19% | 11% |
| Half-tone dot | 50% | 12% | 12% | 13% | 12% | 13% | 22% | 15% |
| area rate | 80% | 9% | 9% | 10% | 9% | 9% | 21% | 9% | were passed through a nip of two heated and pressurized rolls (120° C., 4.0 kgf/cm²), thereby all image layers and all thermosensitive adhesive layers transferred accompanying therewith, which had been transferred onto the image-receiving layer of the intermediate image-receiving sheet, were laminated with coated paper. After cooling, four-color image layers and thermosensitive adhesive layers are transferred onto the coated paper by peeling off the intermediate image-receiving sheet together with the image-receiving layer. By this method, a multicolor image was formed on the coated paper.

As above, method of forming multicolor images was described in Example 1 through 5 and Comparative example 1 and 2. The quality of multicolor images thus made up was comparatively evaluated by the following method.

Evaluation Method

Of the multicolor images prepared by the method of Example 1 through 5 and Comparative example 1 and 2, respective dot gain level at half-tone dots where half-tone area rates of respective colors (yellow, magenta, cyan and black) were 20%, 50% and 80% was determined.

Dot gain level = (half-tone area rate determined) − (half-tone area rate of manuscript)

The half-tone area rate is calculated using Murray-Davies's equation.

Half-tone area rate
$(\%) = 100 \times (1 - 10^{-DT/n})/(1 - 10^{-DS/n})$ $n = 1$ DS = Solid density when putting the brightness of paper on 0
DT = Half-tone dot density when putting the brightness of paper on 0

Besides, the solid density was measured with reflection densitometer Macbeth RD-918.

Results are shown in Table 1.

As evident from the results of Table 1, in accordance with the multicolor image-forming method of the invention, the image-receiving layer of the intermediate image-receiving sheet is not transferred onto the ultimate image-receiving material and only the image is transferred. This does not cause unnecessary gloss on the image as well as decreased optical dot gain level, making it possible to obtain closer multicolor image to printed matter over the conventional method.

What is claimed is:

1. A method of forming a multicolor image, comprising the steps of:
   (a) preparing a photosensitive transfer sheet consisting of a support layer, a release layer, and a colored photosensitive layer in sequence, said colored photosensitive layer being a positive type photosensitive layer comprising a mixture of (i) a photosensitive component soluble in water such that a water-insolubilization reaction is caused by actinic rays, (ii) a synthetic resin emulsion having a glass transition temperature of −20° to 40° C., and (iii) a coloring agent;
   (b) closely contacting the photosensitive transfer sheet with a color-decomposed plate of a manuscript corresponding to said colored photosensitive layer and exposing the photosensitive layer to actinic rays;
   (c) removing a nonimage area of the photosensitive layer, thus forming a color-separated image;
   (d) superposing a surface of said color-separated image with an image-receiving layer of an intermediate image-receiving sheet, the image-receiving layer being supported by a supporter, and simultaneously heating and pressurizing to adhere the surface of the color-separated image to the image-receiving layer, said image-receiving-layer of the intermediate image-receiving sheet comprising one of a sole resin of a copolymer of olefin with α,β-unsaturated carboxylic acid crosslinked with metal ions and a mixture of the sole resin and a resin comprising a copolymer of ethylene with vinyl acetate;
   (e) peeling the release layer and the support layer from the color-separated image, thus transferring only the color-separated image onto the intermediate image-receiving sheet;
   (f) forming respective color-separated images in colored photosensitive layers different from the above by repeating steps (a)–(c) and superimposing the respective color-separated images with an exposed color-separated image which has been transferred to an intermediate image-receiving sheet, simultaneously heating and pressurizing the superposed color-separated images to adhere the superposed color-separated images, and peeling the release layer and the support layer of the respective color-separated images, thus transferring only the color separated images in sequence to form a multicolor image on the intermediate image-receiving sheet; and (g) superposing an exposed surface of the multicolor image formed on the intermediate image-receiving sheet with an ultimate image-receiving material, and simultaneously heating and pressurizing to adhere the multicolor image on the ultimate image-receiving material and then peeling the supporter of the intermediate image-receiving sheet from the surface of the image-receiving layer, thus transferring only the respective color-separated images onto the ultimate image-receiving material to form the multicolor image.

2. The method of forming a multicolor image according to claim 1, wherein the release layer of the photosensitive transfer sheet comprises at least one member selected from the group consisting of styrene-maleic anhydride resin, polyester resin, acrylic resin, melamine resin and vinylidene chloride resin.

3. The method of forming a multicolor image according to claim 1, wherein the synthetic resin emulsion is a member selected from the group consisting of poly(acrylic ester), copolymer of acrylic ester and mixtures therewith, copolymer of ethylene with vinyl acetate, copolymer containing ethylene and vinyl acetate and mixtures therewith.

4. The method of forming a multicolor image according to claim 1, wherein the photosensitive component (i) comprises a water-soluble photocrosslinking agent and a water-soluble resin.

5. The method of forming a multicolor image according to claim 4, wherein the water-soluble photocrosslinking agent is a member selected from the group consisting of diazo resin, azide compound and tetrazonium salt.

6. The method of forming a multicolor image according to claim 4, wherein the water-soluble resin is a member selected from the group consisting of poly(vinyl alcohol), polyacrylamide ad poly(vinyl pyrrolidone) and mixtures thereof.

7. The method of forming a multicolor image according to claim 1, wherein the weight proportion of the sole resin to the resin comprising the copolymer of ethylene with vinyl acetate is 100/0 to 10/90.

* * * * *